(12) United States Patent
Ahn

(10) Patent No.: US 7,419,748 B1
(45) Date of Patent: Sep. 2, 2008

(54) PHOTOMASK WITH REDUCED ELECTROSTATIC DISCHARGE DEFECTS

(75) Inventor: Jae-Gyung Ahn, Pleasanton, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 701 days.

(21) Appl. No.: 10/925,606

(22) Filed: Aug. 24, 2004

(51) Int. Cl.
*G03F 1/00* (2006.01)
(52) U.S. Cl. .......................................... 430/5
(58) Field of Classification Search ............. 430/5, 430/394
See application file for complete search history.

(56) References Cited

U.S. PATENT DOCUMENTS

| | | | |
|---|---|---|---|
| 5,989,754 A | 11/1999 | Chen | |
| 6,309,781 B1 | 10/2001 | Gemmink | |
| 6,569,576 B1* | 5/2003 | Hsueh et al. | 430/5 |
| 6,596,444 B2 | 7/2003 | Buck | |
| 6,596,552 B2 | 7/2003 | Englisch | |
| 6,622,295 B1 | 9/2003 | Schepp | |
| 6,660,540 B2 | 12/2003 | Englisch | |
| 6,734,443 B2 | 5/2004 | Zheng | |
| 6,861,179 B1* | 3/2005 | Hsieh et al. | 430/5 |
| 2004/0229129 A1* | 11/2004 | Allen et al. | 430/5 |

* cited by examiner

*Primary Examiner*—Stephen Rosasco
(74) *Attorney, Agent, or Firm*—Kenneth Glass; Glass & Associates

(57) ABSTRACT

A photomask and a method for forming a photomask are disclosed in which the photomask pattern is modified to bridge features that are likely to produce electrostatic discharge related defects. In one embodiment those adjacent features that are closely spaced together and have a high surface area differential, are bridged using a bridge that has a width less than the minimum optical resolution of the photolithography process.

21 Claims, 6 Drawing Sheets

PHOTOMASK WITH REDUCED ELECTROSTATIC DISCHARGE DEFECTS

FIELD OF THE INVENTION

The present invention relates to the field of photolithography. More specifically, the present invention relates to a photomask and a method for forming a photomask having reduced electrostatic discharge defects.

BACKGROUND ART

Photomasks are used in semiconductor manufacturing processes to transfer patterns onto semiconductor wafers and other substrates. In conventional semiconductor manufacturing processes an integrated circuit design is submitted to a photomask manufacturer in electronic form. The photomask manufacturer converts the integrated circuit design into a photomask pattern that is stored in a pattern data file. This photomask pattern is then transferred to an opaque layer of a photomask to form a photomask that includes a non-opaque substrate and a patterned opaque layer.

One type of photomask, typically referred to as a reticle, is designed for use in a stepper or scanner. The stepper or scanner generates coherent light that passes through the reticle so as to transfer the pattern on the reticle to a photosensitive layer on the semiconductor wafer or other substrate. Reticles are typically formed using a photomask blank that includes a glass plate that is coated with a thin layer of metal, and a photoresist layer that extends over the metal layer. The photomask blank is optically exposed using the photomask pattern. The photomask blank is then developed and etched to pattern the metal layer, forming a reticle having the desired pattern.

Photomask patterns typically include multiple die regions that include structures of varying size and shape. Charge imbalances between the structures on the photomask can lead to electrostatic discharge related defects. More particularly, electrical charge can move between adjacent structures, resulting in damage to the glass plate and/or damage to the patterned metal layer. This damage to the photomask can alter the optical characteristics of the photomask such that the photomask no longer generates the desired optical pattern.

Accordingly, there is a need for a method for forming a photomask having reduced electrostatic discharge related defects. Also, there is a need for a photomask having reduced electrostatic discharge related defects. The present invention meets the above needs.

DISCLOSURE OF THE INVENTION

The present invention provides a photomask and a method for forming a photomask having reduced electrostatic discharge related defects. A method for forming a photomask is disclosed in which the photomask pattern is modified to bridge features that are likely to produce electrostatic discharge related defects. In one embodiment those adjacent features that are closely spaced together and have a high surface area differential, are bridged using a bridge that has a width less than the minimum optical resolution of the photolithography process. This produces a photomask that includes bridges that connect structures that are likely to produce electrostatic discharge related defects. This prevents electrostatic discharge related defects between the connected structures, reducing the number of electrostatic discharge related defects in the photomask.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as riot to unnecessarily obscure aspects of the present invention.

Figure 1:
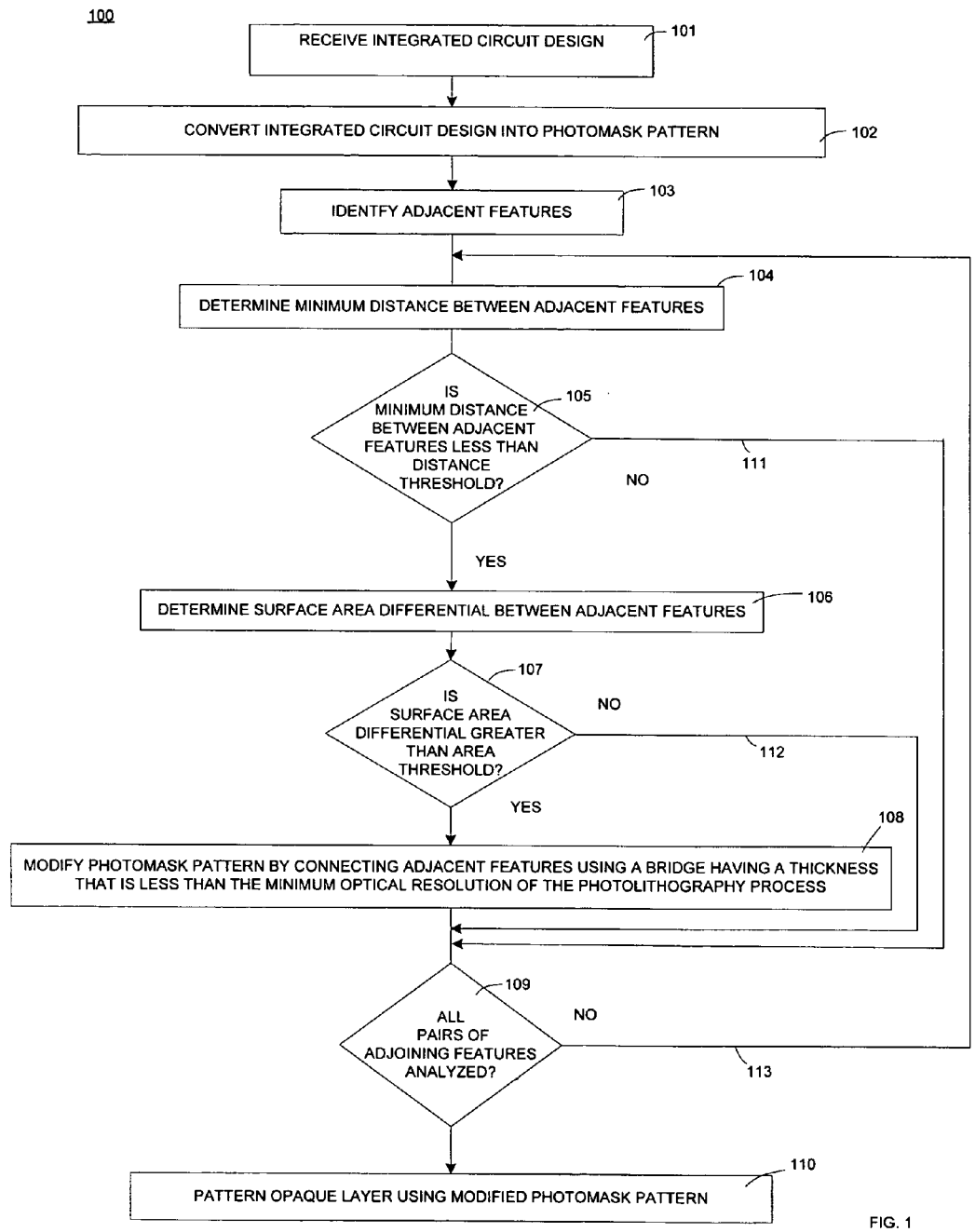
FIG. 1 is a flow chart that illustrates a method for forming a photomask having reduced electrostatic discharge related defects in accordance with one embodiment of the present invention.

FIG. 1 illustrates a method 100 for forming a photomask having reduced electrostatic discharge related defects. As shown by step 101 an integrated circuit design is received. The integrated circuit design is typically received in the form of a computer-readable media such as a tape, Computer Disk (CD) or Digital Video Disk (DVD) that includes one or more file that specifies the integrated circuit design. The integrated circuit design can also be received in the form of a file or data stream that is transferred electronically over the Internet or over some other communication medium. In the present embodiment, along with the integrated circuit design, photomask specifications are received that indicate the type of photomask to be produced. Examples of photomask specifications that are typically included with a photomask order include the number of die regions to be formed on the photomask, the minimum optical resolution of the photolithography process, magnification, etc.

The integrated circuit design is converted into a photomask pattern as shown by step 102. In the present embodiment a computer program is used to convert the integrated circuit design into a photomask pattern that meets the received photomask specifications. The photomask pattern is then stored digitally in a pattern data file.

Figure 2:
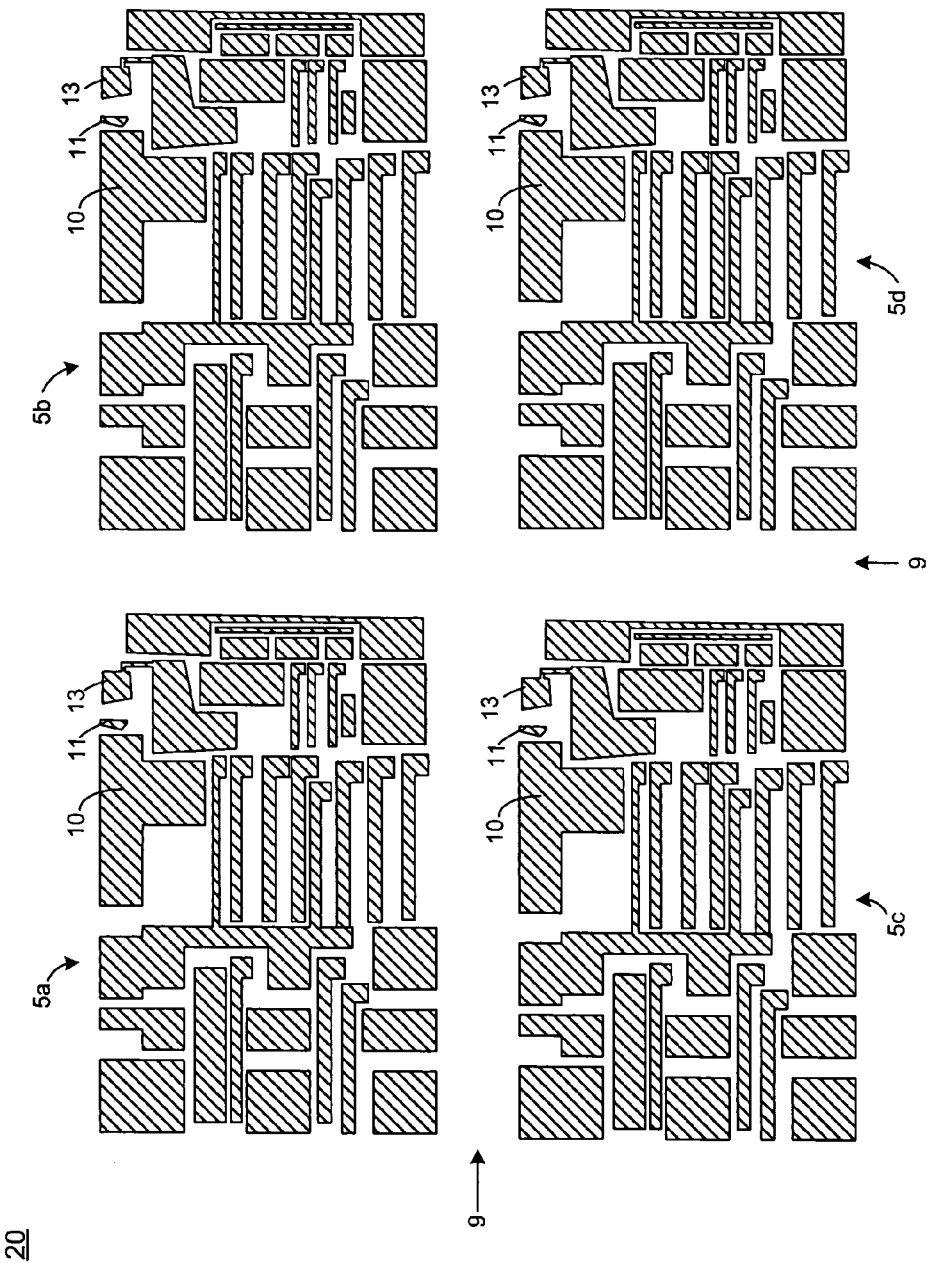
FIG. 2 illustrates an exemplary photomask pattern that represents an integrated circuit design, and that includes four die regions, in accordance with one embodiment of the present invention.
Figure 3:
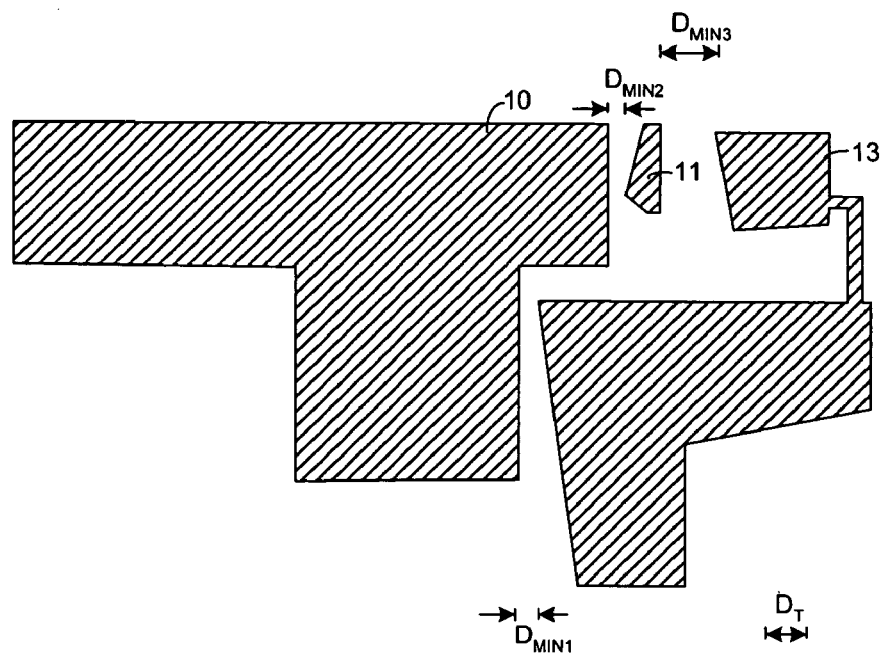
FIG. 3 illustrates an enlarged view of some of the features in the photomask pattern of FIG. 2 in accordance with one embodiment of the present invention.

FIGS. 2-3 illustrate features of an exemplary photomask pattern 20 that is formed by converting an integrated circuit design received in step 101 of FIG. 1 into four die regions 5a-5d that are separated by scribe streets 9. Die regions 5a-5d are identical, each representing the integrated circuit design received in step 101 and conforming with the photomask specifications received from the client. Exemplary features 10, 11 and 13 are features specified in the integrated circuit design that conform to the received photomask specifications.

Referring now to steps 103-107 and 109, an analysis is performed to determine which features, if any, within the photomask pattern are likely to produce electrostatic discharge related defects. The electric field between two adjacent bodies is inversely proportional to the distance between the two adjacent bodies and is a function of the area differential between the two bodies. With regard to structures formed on a photomask, it has been found that electrostatic discharge related defects are likely to occur when the minimum distance between adjacent features is less than 0.40 microns, and when the area differential between the two features is greater than 500 $\mu m^2$. Accordingly, in one embodiment of the present invention, those adjacent features having a minimum distance that is less than 0.40 microns, and an area differential that is greater than 500 $\mu m^2$ are identified as features that are likely to produce electrostatic discharge related defects.

Referring now to step 103 adjacent features are identified. More particularly, the photomask pattern is analyzed to determine which features, within each die region, are adjacent. In the present embodiment features that are connected are considered as a single feature since features that are connected will produce corresponding structures on a photomask that can convey electrical charge between each of the connected structures.

Referring now to steps 104-107, each of the pairs of adjacent features identified in step 103 are analyzed to determine whether they are likely to produce electrostatic discharge related defects. First, as shown by step 104 the minimum distance between adjacent features is determined. More particularly, for each pair of adjacent features, the shortest space between any point on the first feature and any point on the second feature, between which a line can be drawn that does not intersect any other feature, is the minimum distance between the adjacent features. Accordingly, the minimum distance is the closest distance between the adjacent features that does not pass through any other feature. In the present embodiment the scale of the photomask pattern in the pattern data file has the same scale as the pattern that will be formed on the opaque layer of the photomask. Accordingly, when the features in the photomask pattern are separated by a given distance, the corresponding structures formed on the photomask will be separated by the same distance.

Referring now to step 105, the minimum distance of each pair of adjacent features is compared to a distance threshold. In one embodiment of the present invention a distance threshold of 0.40 microns is used. When the minimum distance between the adjacent features is not less than the distance threshold, the adjacent features are not likely to produce electrostatic discharge related defects, and the analysis proceeds to the next pair of adjacent features as shown by line 111.

When the minimum distance between the adjacent features is less than the distance threshold (step 105), the surface area differential between the adjacent features is determined as shown by step 106. The surface area differential is the area of the largest feature minus the area of the smaller feature.

The determined surface area differential is then compared to an area threshold as shown by to step 107. In one embodiment an area threshold 500 square microns is used. When the surface area differential between the adjacent features is not greater than the area threshold, the adjacent features are not likely to produce electrostatic discharge related defects and the analysis proceeds to the next pair of adjacent features as shown by line 112.

As shown by steps 107-108, when the surface area differential between adjacent features is greater than the area threshold, the photomask pattern is modified by connecting the adjacent features using a bridge having a thickness that is less than the minimum optical resolution of the photolithography process. Though any bridge size can be used that is less than the minimum optical resolution of the photolithography process, in one embodiment, a bridge is used that has a width that is half of the minimum line width that can be resolved by the photolithography process. This will assure that the bridge will not be resolved in the photolithography process.

The process of steps 104-108 proceeds as shown by line 113 until all adjacent features identified in step 103 have been analyzed, producing a modified photomask pattern in which those adjacent features likely to produce electrostatic discharge related defects are connected. In the present embodiment only those features that are determined to be likely to produce electrostatic discharge related defects are connected. The modified photomask pattern can be stored electronically in a modified pattern data file.

As shown by step 110 the modified photomask pattern is used to pattern the opaque layer of the photomask. This will produce a photomask having an opaque layer that includes bridges that connect adjacent structures that are likely to result in static discharge related defects.

In the present embodiment a distance threshold of 0.40 and an area threshold of 500 square microns are used. However, it is appreciated that both the distance threshold and the area threshold can be varied according to the needs of a particular fabrication process. For example, it may be desirable to use more restrictive criteria (a smaller distance threshold and/or a larger area threshold). In one embodiment a distance threshold of 0.20 microns and an area threshold of 650 are used. This will reduce the computation time, resulting in faster identification of structures that are likely to produce electrostatic discharge related defects. Also, since the likelihood that any pair of adjacent features will result in an electrostatic discharge related defect increases as the objects are spaced closer together and as their size differential increases, the features that meet these criteria will be more likely to cause electrostatic discharge related defects. Similarly, a larger distance threshold and/or a smaller area threshold can be used when it is important to make sure that electrostatic discharge related defects do not occur in a particular photomask. In one specific embodiment the distance threshold and the area threshold are established by the client when ordering a photomask.

In one embodiment a computer is used to perform some or all of the steps of method 100. In one embodiment the computer is operable to perform method 100 using instructions (e.g., a software program) stored on a computer-readable media such as a Compact Disc (CD), a Digital Video Disk (DVD), floppy disk, etc. In the present embodiment a software program, operable on the computer, receives the integrated circuit design (step 101), converts the integrated circuit design into a photomask pattern (step 102), determine which features, if any, within the photomask pattern are likely to produce electrostatic discharge related defects (steps 103-107 and 109), modify the photomask pattern (step 108) and generate output that can be used to pattern an opaque layer of a photomask (110).

In one embodiment a first computer program is operable to perform steps 101-102 and a second computer program is used to perform some or all of steps 102-110. These computer program(s) can be stored on a data storage device of a computer or can be stored on one or more computer-readable media.

In one embodiment the process of identifying those structures that are likely to cause electrostatic discharge related defects is performed during the process of converting the integrated circuit design into a photomask pattern. Accordingly, steps 102 and 103-109 of method 100 are performed contemporaneously. One advantage of performing steps 102 and 103-109 contemporaneously is that a single analysis of each adjacent structure can be performed prior to reproducing the integrated circuit design into multiple die regions.

In another embodiment, an optical proximity correction program is used to perform method 100. In this embodiment, steps 103-109 are performed at the same time that the features in the photomask pattern are being modified to correct for optical proximity effects (e.g., closed contacts, shortened or rounded lines, topographic effects), resulting in a single modified photoresist pattern that includes both optical proximity effect corrections and corrections for reducing electrostatic discharge related defects.

Though the process of method 100 is described as analyzing all of the features in the photoresist pattern, in one alternate embodiment, only the features in one die region are analyzed using steps 104-107 and 109. Those features in the analyzed die region that are likely to cause electrostatic discharge related defects are then connected in the same manner as in step 108. These same features are then identified in each of the other die regions and are connected.

Following is an exemplary analysis of structures 10, 11 and 13 of FIGS. 2-3 in accordance with method 100 of FIG. 1. First, the integrated circuit design is received and converted into a photomask pattern 20. Adjacent features are then identified as shown by step 103. In the embodiment shown in FIGS. 2-3, feature 13 includes a top feature and a bottom feature that are connected by a line. Though the top feature, the bottom feature and the line are distinct features in the integrated circuit design, they are considered to be a single feature 13 in steps 103-109 since they are connected. Accordingly, the features shown in FIG. 3 will include three pairs of adjacent features: a first pair made up of features 13 and 10, a second pair made up of features 10 and 11, and a third pair made up of features 11 and 13.

Adjacent features 13 and 11 are analyzed by first determining the minimum distance between adjacent features 13 and 11 (step 104), which is shown as minimum distance $D_{MIN3}$ in FIG. 3. The minimum distance $D_{MIN3}$ is then compared to the distance threshold $D_T$ (step 105). Since the minimum distance $D_{MIN3}$ is not less than the distance threshold $D_T$ of 0.40 microns, adjoining pair of features 13 and 11 are not likely to produce electrostatic discharge related defects, and the process proceeds to the next set of adjacent features as shown by line 111.

Adjacent features 13 and 10 are then analyzed. First, the minimum distance between adjacent features 13 and 10 is determined (step 104), which is shown as minimum distance $D_{MIN1}$ in FIG. 3. The minimum distance $D_{MIN1}$ between adjacent features 13 and 10 is then compared to the distance threshold $D_T$ (step 105). Since the minimum distance $D_{MIN1}$ is less than the distance threshold $D_T$, the surface area differential of adjacent features 13 and 10 is determined (step 106). More particularly, the area of feature 13 and the area of feature 10 are calculated, and the calculated area of feature 13 is subtracted from the calculated area of feature 10. However, when the calculated surface area differential of adjacent features 13 and 10 is compared to the area threshold of 500 square microns (step 107), the surface area differential of adjacent features 13 and 10 is found to be less than the threshold area differential of 500 square microns. Accordingly, adjacent features 13 and 10 are determined to not be likely to produce electrostatic discharge related defects and the process proceeds to the next pair of adjacent features as shown by line 112.

Figure 4:
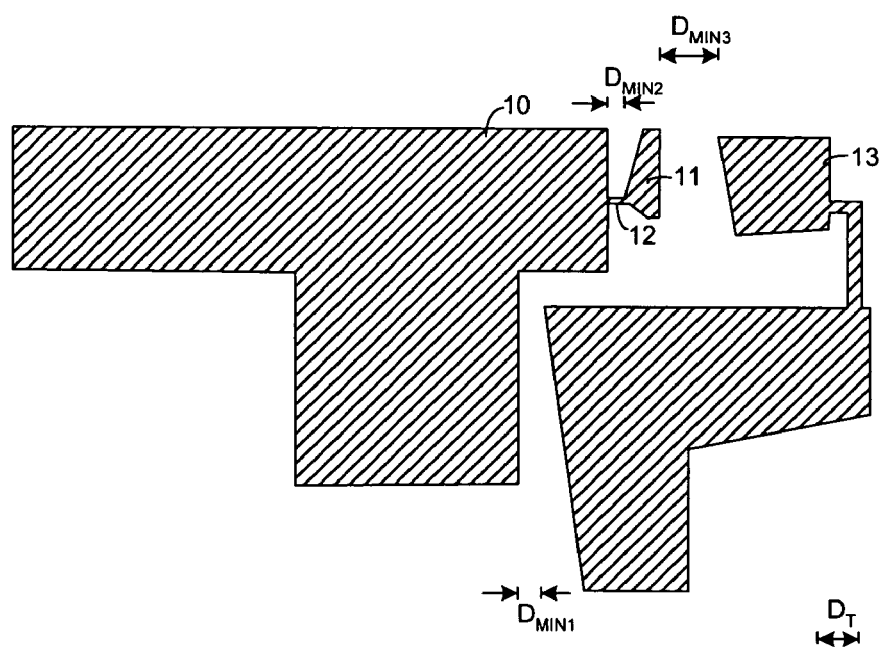
FIG. 4 illustrates the features shown in FIG. 3 after the photomask pattern has been modified to include bridges that connect adjacent features that are likely to produce electrostatic discharge related defects in accordance with one embodiment of the present invention.
Figure 5:
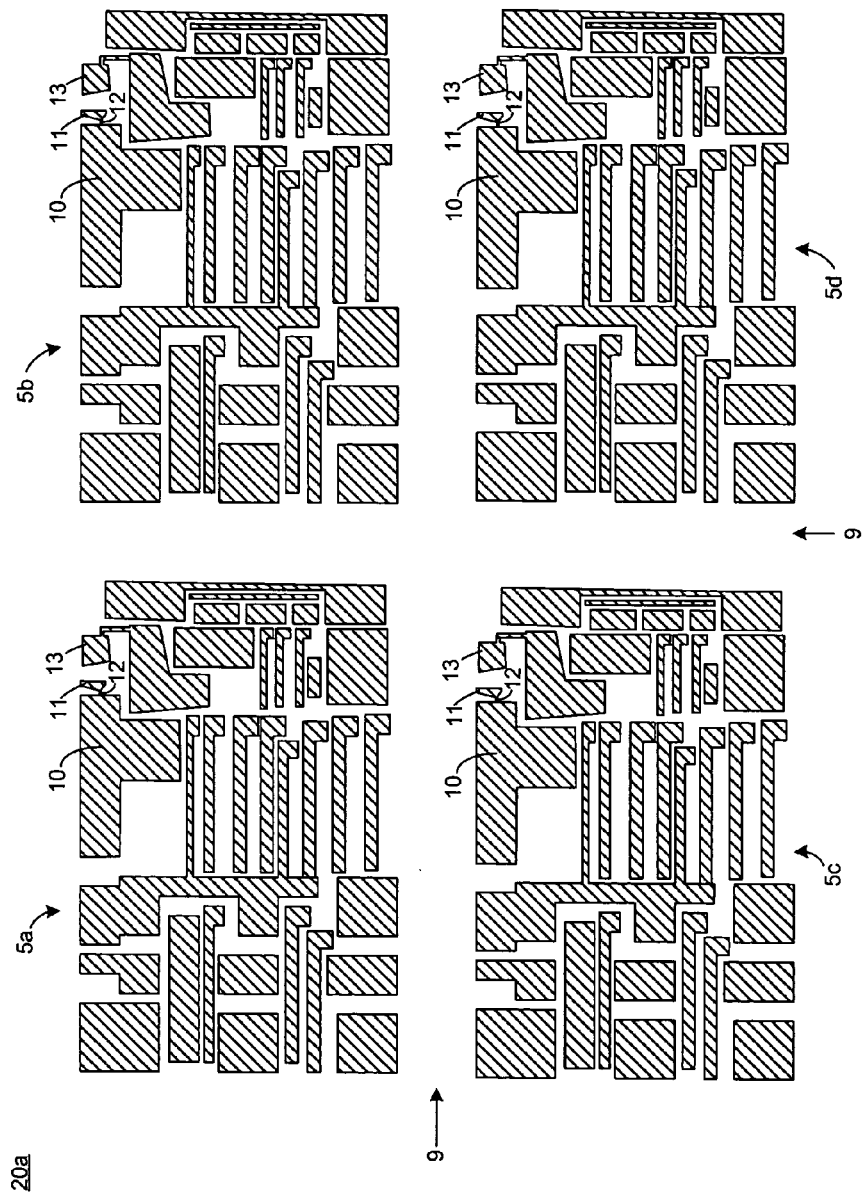
FIG. 5 illustrates the photomask pattern shown in FIG. 2 after the photomask pattern has been modified to include bridges that connect adjacent features that are likely to produce electrostatic discharge related defects in accordance with one embodiment of the present invention.

Adjacent features 10 and 11 are then analyzed. The minimum distance $D_{MIN2}$ between adjacent features 10 and 11 is determined (step 104). Minimum distance $D_{MIN2}$ is then compared to the distance threshold $D_T$ (step 105). Since the minimum distance $D_{MIN2}$ is less than the distance threshold $D_T$, the surface area differential of adjacent features 10 and 11 is determined (step 106). More particularly, the area of features 10 and 11 are calculated and the area of feature 11 is subtracted from the area of feature 10. In the present embodiment the surface area differential of adjacent features 10, 11 is greater than the area threshold of 500 square microns (step 107). Accordingly, adjacent features 10, 11 are likely to produce electrostatic discharge related defects. As shown in FIG. 4, adjacent features 10, 11 are connected (step 108) using a bridge 12 having a thickness that is less than the minimum optical resolution of the photolithography process. In the present embodiment bridge 12 has a width that is half of the minimum optical resolution of the photolithography process and is placed across the minimum distance between adjacent features 10, 11. However, bridge 12 could be placed at other locations, and could have any width that is less than the minimum optical resolution of the photolithography process. Referring now to FIG. 5, when all of the adjacent features in each die region 5a-5d have been analyzed, and adjoining features within each die region 5a-5d have been connected, a modified photomask pattern 20a is formed that includes connecting bridges 12.

Figure 6:
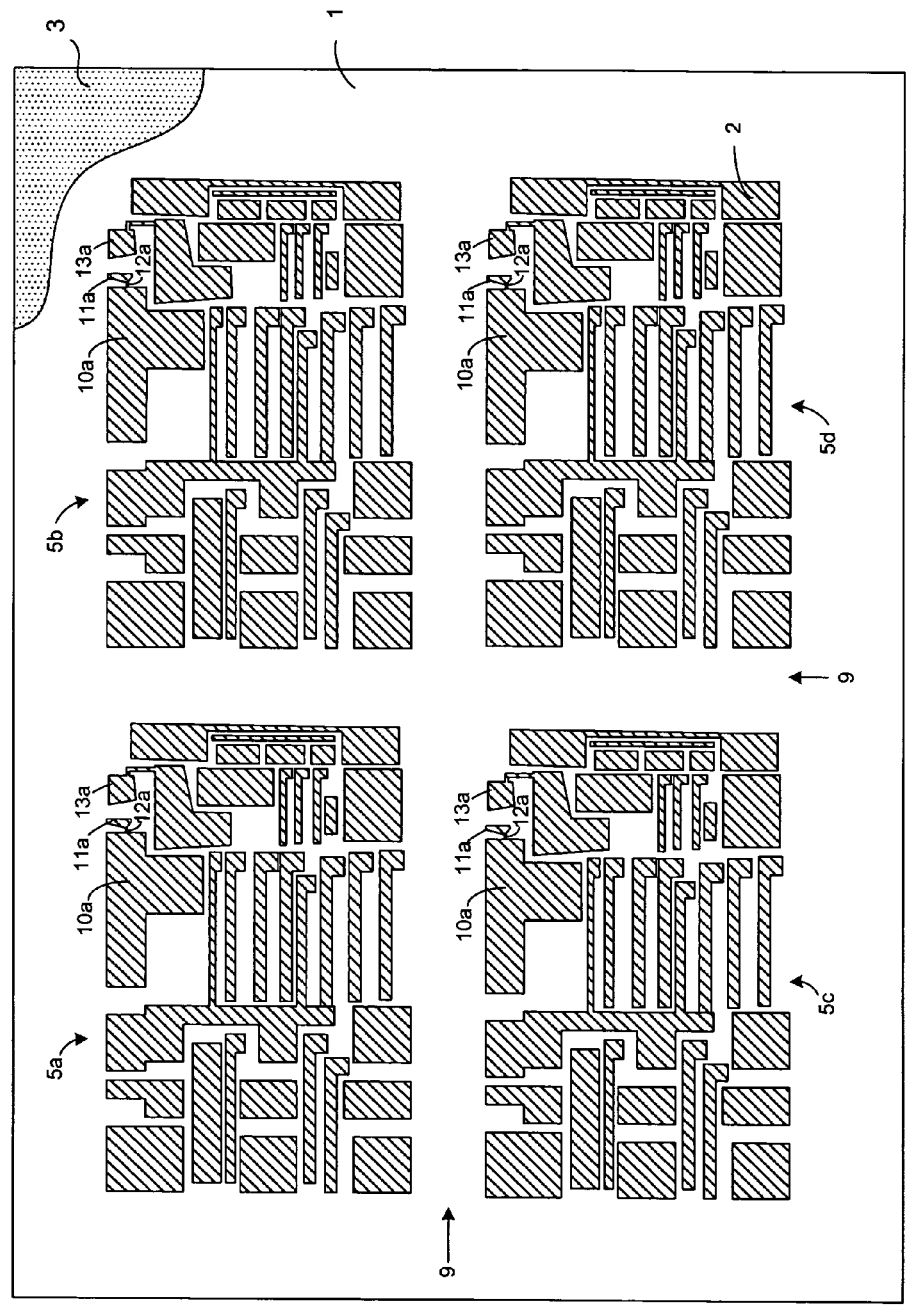
FIG. 6 illustrates a partially cut-away top view of a photomask having reduced electrostatic discharge related defects in accordance with one embodiment of the present invention.
Figure 7:
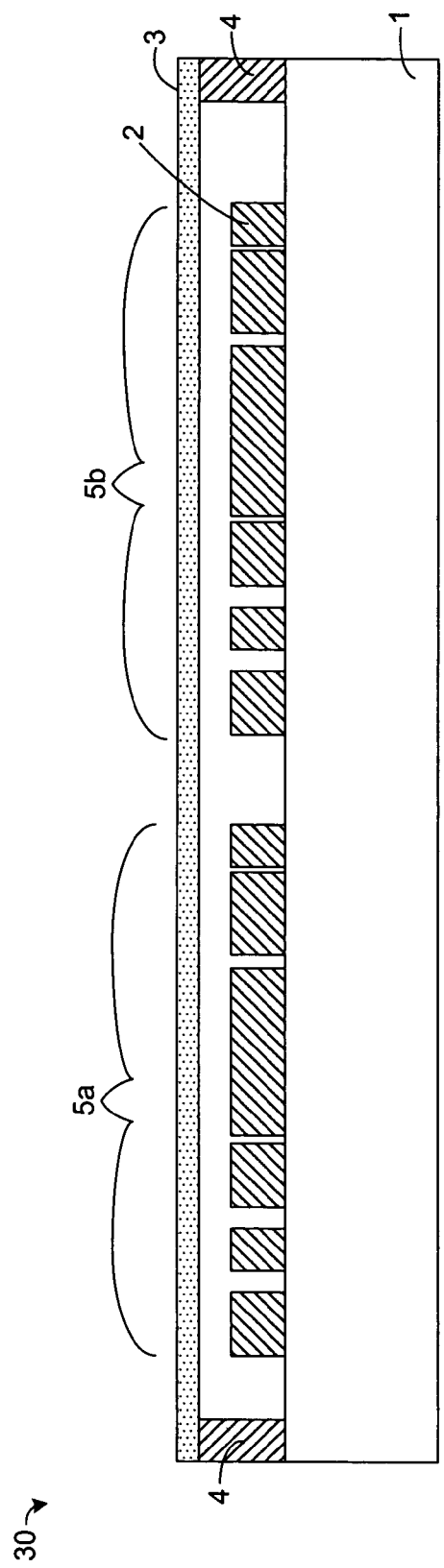
FIG. 7 illustrates a side cross-sectional view of the photomask of FIG. 6 in accordance with one embodiment of the present invention.

The modified photomask pattern 20a is then used to pattern an opaque layer of a photomask. The photomask formed using method 100 can include a flexible or a rigid substrate and can be the same size as the images to be resolved (1×1 magnification) or can be used to resolved images that are 2×, 3×, 4× or smaller than the pattern on the photomask. In one specific embodiment that is illustrated in FIGS. 6-7, a photomask 30 is formed that is a reticle designed for use in a stepper. In this embodiment the opaque layer 2 of the photomask is a thin layer of metal such as chrome or iron oxide, which is disposed over a glass substrate 1. Substrate 1 can be high-purity quartz, borofloat or sodalime glass, or can be formed using other, non-opaque materials. In one embodiment photomask 30 is formed by patterning a photomask blank using the modified photomask pattern 20a. More particularly, the photomask blank is exposed using modified photomask pattern 20a, and is developed and etched to form opaque layer 2. A pellicle 3 is then attached to substrates using frame 4.

Referring now to FIG. 6, the pattern of opaque layer 2 includes structures 10a-13a that correspond to features 10-13 in photomask pattern 20a. Since the width of bridge 12a has a width less than the minimum optical resolution of the photolithography process that is to be used, when photomask 30 is used to form a pattern on a semiconductor wafer or other substrate, bridge 12a will not produce an image on the substrate. Accordingly, the photomask of the present invention and the method for forming a photomask of the present invention will not result in any changes to the resulting optical pattern.

By connecting structures 10 and 11 using bridge 12, the occurrence of an electrostatic discharge related defect between features 10 and 11 is avoided. This produces a photomask 30 having reduced electrostatic discharge related defects.

The preferred embodiment of the present invention is thus described. While the present invention has been described in particular embodiments, it should be appreciated that the present invention should not be construed as limited by such embodiments, but rather construed according to the following claims.

What is claimed is:

1. A method for preventing electrostatic discharge related defects in a photomask comprising:
   determining the surface area differential between adjacent features in a die region of a photomask pattern; and
   connecting the adjacent features in the die region of the photomask pattern that are separated by a minimum distance that is less than 0.40 microns and that have a surface area differential that is greater than an area threshold using a bridge that has a width that is less than the minimum optical resolution of the photomask.

2. The method of claim 1 wherein the bridge only extends between the connected adjacent features.

3. The method of claim 2 further comprising:
   forming a modified photomask pattern that includes the bridge; and
   fabricating a photomask using the modified photomask pattern.

4. The method of claim 3 wherein the modified photomask pattern comprises an image that is stored in a pattern data file.

5. The method of claim 3 wherein the photomask comprises a reticle that includes a glass substrate and a pellicle that is coupled to the glass substrate.

6. The method of claim 2 wherein the area threshold is 650 square microns.

7. The method of claim 2 wherein the area threshold is 500 square microns.

8. A method for forming a photomask to be used in a photolithography process comprising:
   determining the minimum distance between adjacent features in a die region of a photomask pattern;
   determining the surface area differential of the adjacent features in the die region of the photomask pattern; and
   connecting the adjacent features in the die region of the photomask pattern that have a minimum distance that is less than a first threshold and that have a surface area differential that is greater than a second threshold using bridges having a width that is less than the minimum optical resolution of the photolithography process.

9. The method of claim 8 wherein the bridges only extend between the adjacent features in the die region of the photomask pattern that have a minimum distance that is less than the first threshold and that have a surface area differential that is greater than the second threshold.

10. The method of claim 9 wherein the first threshold is less than or equal to 0.40 microns.

11. The method of claim 8 further comprising:
    forming a modified photomask pattern that includes the bridges connecting the adjacent features; and
    fabricating a photomask using the modified photomask pattern.

12. The method of claim 11 wherein the fabricating a photomask further comprises patterning an opaque layer of the photomask using the modified photomask pattern.

13. The method of claim 8 the second threshold is greater than or equal to 500 square microns.

14. A photomask for exposing an integrated circuit design in a photolithography process comprising:
    a non-opaque substrate; and
    a patterned opaque layer that overlies the substrate, the patterned opaque layer including bridges having a width that is less than the minimum optical resolution of the photolithography process, a single one of the bridges extending between adjacent features in a die area of the patterned opaque layer that are separated by a minimum distance that is less than 0.40 microns and that have a surface area differential that is greater than an area threshold.

15. The photomask of claim 14 wherein the bridges do not extend between any adjacent features in the die area of the patterned opaque layer that have a minimum distance that is greater than 0.40 microns.

16. The photomask of claim 14 wherein the bridges do not extend between any adjacent features in the die area of the patterned opaque layer that have a surface area differential that is not greater than the area threshold.

17. The photomask of claim 16 wherein only the adjacent features in the die region of the patterned opaque layer that that are separated a minimum distance that is less than a distance threshold are connected using the bridges, wherein the distance threshold is less than 0.40 microns.

18. The photomask of claim 14 wherein the area threshold is 500 square microns.

19. A computer-readable medium having computer-executable instructions for performing a method for forming a photomask pattern to be used in a photolithography process, comprising:
    determining the minimum distance between adjacent features in a die region of a photomask pattern;
    determining the surface area differential of the adjacent features in the die region of the photomask pattern; and
    connecting the adjacent features in the die region of the photomask pattern that have a minimum distance that is less than a first threshold and that have a surface area differential that is greater than a second threshold using bridges having a width that is less than the minimum optical resolution of the photolithography process.

20. A computer-readable medium as described in claim 19 wherein the bridges only extend between the adjacent features in the die region of the photomask pattern that have a minimum distance that is less than the first threshold and that have a surface area differential that is greater than the second threshold.

21. A computer-readable medium as described in claim 19 wherein the first threshold is 0.20 microns and the second threshold is 650 square microns.

* * * * *

UNITED STATES PATENT AND TRADEMARK OFFICE
CERTIFICATE OF CORRECTION

PATENT NO.         : 7,419,748 B1                                             Page 1 of 1
APPLICATION NO.    : 10/925606
DATED              : September 2, 2008
INVENTOR(S)        : Jae-Gyung Ahn It is certified that error appears in the above-identified patent and that said Letters Patent is hereby corrected as shown below:

Column 2, line 61, "riot" should read --not--.

Column 6, line 66, "substrates" should read --substrate 1--.

Column 8, line 11, "8 the" should read --8 wherein the--.

Signed and Sealed this

Sixth Day of April, 2010

David J. Kappos
*Director of the United States Patent and Trademark Office*